(12) United States Patent
Ekstrand

(10) Patent No.: US 7,242,710 B2
(45) Date of Patent: Jul. 10, 2007

(54) ALIASING REDUCTION USING COMPLEX-EXPONENTIAL MODULATED FILTERBANKS

(75) Inventor: Per Ekstrand, Stockholm (SE)

(73) Assignee: Coding Technologies AB, Stockholm (SE)

( * ) Notice: Subject to any disclaimer, the term of this patent is extended or adjusted under 35 U.S.C. 154(b) by 647 days.

(21) Appl. No.: 10/112,869

(22) Filed: Apr. 2, 2002

(65) Prior Publication Data

US 2003/0016772 A1 Jan. 23, 2003

(30) Foreign Application Priority Data

Apr. 2, 2001 (SE) .................................... 0101175

(51) Int. Cl.
H03H 7/30 (2006.01)
(52) U.S. Cl. ........................................ 375/232; 708/323
(58) Field of Classification Search ................ 375/232, 375/229, 230
See application file for complete search history.

(56) References Cited

U.S. PATENT DOCUMENTS

| | | | |
|---|---|---|---|
| 5,285,498 A | | 2/1994 | Johnston |
| 5,436,940 A | * | 7/1995 | Nguyen ...................... 375/240 |
| 5,568,142 A | | 10/1996 | Velazquez et al. |
| 5,732,189 A | * | 3/1998 | Johnston et al. ............. 704/230 |
| 5,812,219 A | | 9/1998 | Heusdens |
| 6,061,705 A | * | 5/2000 | Hellberg ...................... 708/408 |
| 6,680,972 B1 | * | 1/2004 | Liljeryd et al. .............. 375/240 |
| 6,718,295 B2 | | 4/2004 | Hasegawa |
| 6,771,699 B1 | * | 8/2004 | Karaoquz et al. ........... 375/224 |
| 6,856,653 B1 | | 2/2005 | Taniguchi et al. |
| 6,996,198 B2 | * | 2/2006 | Cvetkovic ................... 375/350 |
| 2003/0206577 A1 | * | 11/2003 | Liberti et al. ............... 375/152 |

FOREIGN PATENT DOCUMENTS

| | | |
|---|---|---|
| JP | 07-307632 | 11/1995 |
| JP | 08-237133 | 9/1996 |
| JP | 9-508516 | 8/1997 |
| JP | 11-098023 | 4/1999 |

(Continued)

OTHER PUBLICATIONS

Princen, "The design of nonuniform modulated filterbanks", Nov. 11, 1995, IEEE Transactions on signal processing pp. 2550-2560.*

(Continued)

*Primary Examiner*—Temesghen Ghebretinsae
*Assistant Examiner*—Juan Alberto Torres
(74) *Attorney, Agent, or Firm*—Michael A. Glenn; Glenn Patent Group

(57) ABSTRACT

The present invention proposes a new method and apparatus for the improvement of digital filterbanks, by a complex extension of cosine modulated digital filterbanks. The invention employs complex-exponential modulation of a low-pass prototype filter and a new method for optimizing the characteristics of this filter. The invention substantially reduces artifacts due to aliasing emerging from independent modifications of subband signals, for example when using a filterbank as an spectral equalizer. The invention is preferably implemented in software, running on a standard PC or a digital signal processor (DSP), but can also be hardcoded on a custom chip. The invention offers essential improvements for various types of digital equalizers, adaptive filters, multiband companders and spectral envelope adjusting filterbanks used in high frequency reconstruction (HFR) systems.

9 Claims, 5 Drawing Sheets

FOREIGN PATENT DOCUMENTS

| | | |
|---|---|---|
| JP | 11-145842 | 5/1999 |
| JP | 2001-007769 | 1/2001 |
| WO | WO9857436 * | 12/1998 |
| WO | WO 00/76081 A2 | 12/2000 |
| WO | WO 01/41320 A1 | 6/2001 |

OTHER PUBLICATIONS

Weiss, "Fast implementation of oversampled modulated filter banks", Electronics Letters, vol. 36, Issue 17, Aug. 17, 2000 pp. 1502-1503.☐☐*

Harteneck, "An oversampled filter bank with different analysis and synthesis filters for the use with adaptive filters", Conference Record of the Thirty-First Asilomar Conference on Signals, Systems & Computers, 1997. vol. 2, Nov. 2-5, 1997 pp. 1274-1278 vol. 2.*

Weiss, "Polyphase analysis of subband adaptive filters", Conference Record of the Thirty-Third Asilomar Conference on Signals, Systems, and Computers, 1999, vol. 2, Oct. 24-27, 1999 pp. 903-907 vol. 2.*

Weiss, "On implementation and design of filter banks for subband adaptive systems", IEE Colloquium on Digital Filters: An Enabling Technology, Apr. 20, 1998 pp. 12/1-12/8.*

Robert Brennan et al, "A Flexible Filterbank Structure For Extensive Signal Manipulations in Digital Hearing Aids", IEEE 1998, Ontario, Canada, N2J 4V1.

H. Malvar, "A Modulated Complex Lapped Transform and its Applications to Audio Processing", Technical Report MSR-TR-99-27, May 1999, Microsoft Research, Microsoft Corporation, Redmond, WA, pp. 1-9.

T. Karp, et al, "Modified DFT Filter Banks with Perfect Reconstructions", IEEE Transactions on Circuits and Systems—II: Analog and Digital Signal Processing, vol. 46, No. 11, Nov. 1999, pp. 1404-1414.

Hartneck, Weiss, Stewart; Design of Near Perfect Reconstruction Oversampled Filter Banks for Subband Adaptive Filters: IEEE Transactions on Circuits and Systems—II. Analog and Digital Processing: vol. 46, No. 9, Aug. 31, 1999, pp. 1081-1085, XP011013098.

Weiss S et al; "Efficient Subband Adaptive Filterimg with Overmapled GDFT Filter Banks"; Dig. IEE Colloqium Adaptive Signal PRocessing for Modlle Communication Systems, Oct. 29, 1997, pp. 4-1, XP006506797.

Karp, Fliege; "MOdified DFT Filter Banks with Perfect Reconstruction"; IEEE Transactions on Circuits and Systems—II; Analog and Digital Signal Processing; vol. 46, No. 11; Nov. 30, 1999; pp. 1404-1414; XP011013146.

Bradley, P., "Analysis/Synthesis filter bank design based on time domain aliasing cancellation", IEEE Transaction on Acoustics, Speech, and Signal Processing, Oct. 1986, pp. 1153-1161, vol. ASSP-34, No. 5; Also Retrieved from the Internet at http://ieeexplore.ieee.org/ on Dec. 18, 2006.

English Translation of Office Action for Japanese Patent Application No. 2002-578650 dated Nov. 21, 2006.

Japanese Office Action for Japanese Patent Application No. 2002-578650 dated Nov. 21, 2006.

* cited by examiner

ALIASING REDUCTION USING COMPLEX-EXPONENTIAL MODULATED FILTERBANKS

TECHNICAL FIELD

The present invention relates to the area of subsampled digital filterbanks and provides a new method and apparatus for substantial reduction of impairments emerging from modifications, for example quantization or attenuation, of the spectral coefficients or subband signals of digital filterbanks. The invention is applicable to digital equalizers ["An Efficient 20 Band Digital Audio Equalizer" A. J. S. Ferreira, J. M. N. Viera, AES preprint, $98^{th}$ Convention 1995 February 25–28 Paris, N.Y., USA], adaptive filters [Adaptive Filtering in Subbands with Critical Sampling: Analysis, Experiments, and Application to Acoustic Echo Cancellation" A. Gilloire, M. Vetterli, IEEE Transactions on Signal Processing, vol. 40, no. 8, August, 1992], multiband companders, and to audio coding systems using high frequency reconstruction (HFR), where a digital filterbank is used for the adaptive adjustment of the spectral envelope, such as the Spectral Band Replication (SBR) system [WO 98/57436].

BACKGROUND OF THE INVENTION

A digital filter bank is a collection of two or more parallel digital filters. The analysis filter bank splits the incoming signal into a number of separate signals named subband signals (or spectral coefficients). The filter bank is critically sampled (or maximally decimated) when the total number of subband samples per unit time is the same as that for the input signal. The synthesis filter bank combines these subband signals into an output signal. A popular type of critically sampled filterbanks is the cosine modulated filterbank. The filters in the cosine modulated system are obtained by cosine modulation of a low-pass filter, a so-called prototype filter. The cosine modulated banks offer very effective implementations and are often used in natural audio codecs ["Introduction to Perceptual Coding" K. Brandenburg, AES, Collected Papers on Digital Audio Bitrate Reduction, 1996]. However, any attempt to alter the subband samples or spectral coefficients, e.g. by applying an equalizing gain curve or quantizing the samples, renders severe aliasing artifacts in the output signal.

SUMMARY OF THE INVENTION

The present invention shows that impairments emerging from modifications of the subband signals can be significantly reduced by extending a cosine modulated filterbank with an imaginary sine modulated part, forming a complex-exponential modulated filterbank. The sine extension eliminates the main alias terms present in the cosine modulated filterbank. Moreover, the invention presents a method, referred to as alias term minimization (ATM), for optimization of the prototype filter. The complex-exponential modulation creates complex-valued subband signals that can be interpreted as the analytic signals of the signals obtained from the real part of the filterbank, i.e. the underlying cosine modulated filterbank. This feature provides an inherent measure of the instantaneous energy of the subband signals.

The main steps for operation of the complex-exponential modulated filterbank according to the present invention are:

1. The design of a symmetric low-pass prototype filter with cutoff frequency $\pi/2M$, optimized for a desired aliasing rejection and passband flatness;
2. The construction of an M-channel filterbank by complex-exponential modulated of the optimized prototype filter;
3. The filtering of a real-valued time domain signal through the analysis part of the filterbank;
4. The modification of the complex-valued subband signals according to a desired, possibly time-varying, equalizer setting;
5. The filtering of the modified complex-valued subband samples through the synthesis part of the filterbank; and
6. The computation of the real part of the complex-valued time domain output signal obtained from the synthesis part of the filterbank.

The most attractive applications of the invention are improvement of various types of digital equalizers, adaptive filters, multiband companders and adaptive envelope adjusting filterbanks used in HFR systems.

BRIEF DESCRIPTION OF THE DRAWINGS

The present invention will now be described by way of illustrative examples, not limiting the scope nor the spirit of the invention, with reference to the accompanying drawings, in which.

DESCRIPTION OF PREFERRED EMBODIMENTS

It should be understood that the present invention is applicable on a range of implementations that incorporates digital filterbanks other than those explicitly mentioned in this patent.

Digital Filterbanks

Figure 1:
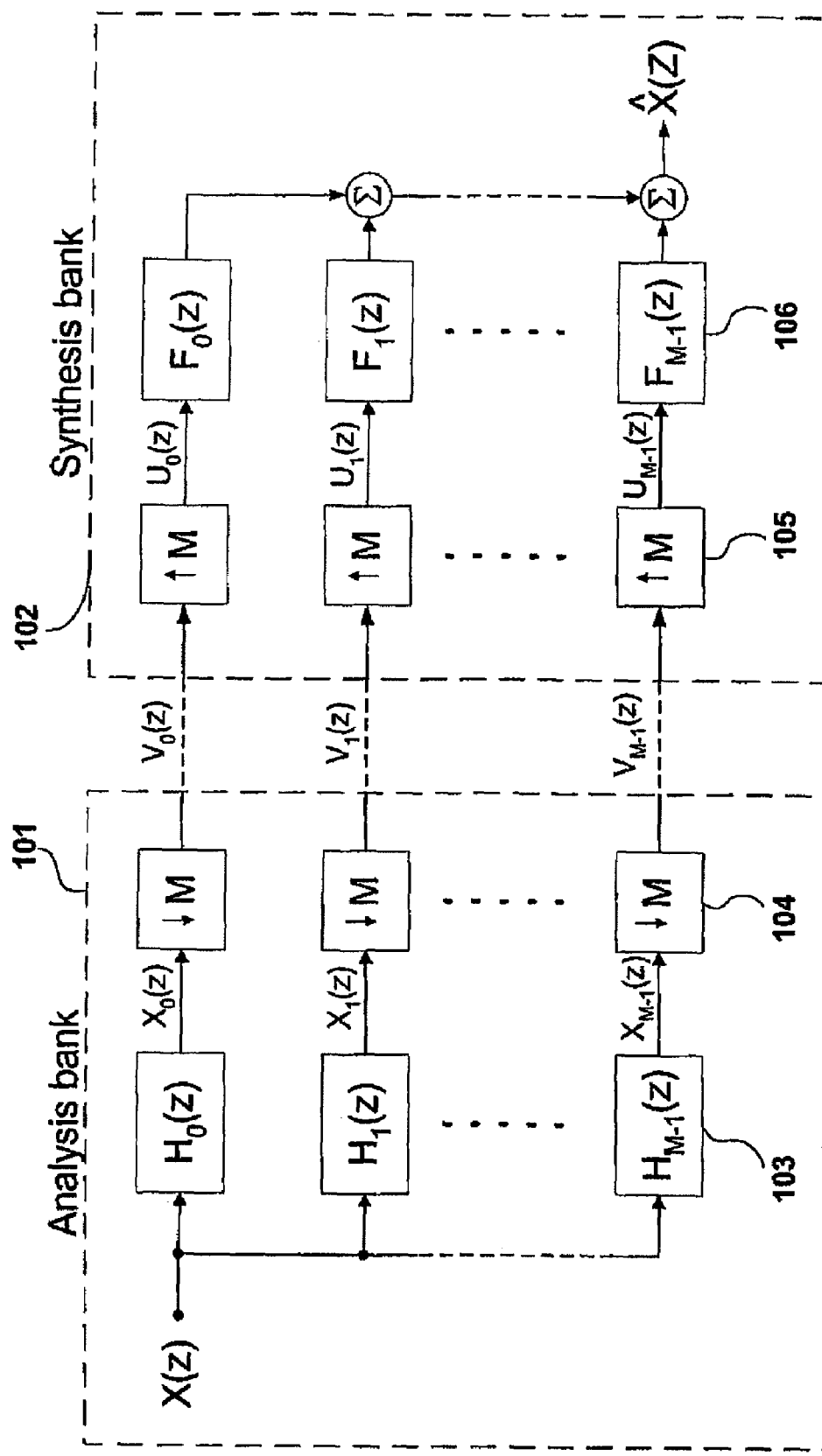
FIG. 1 illustrates the analysis and synthesis sections of a digital filterbank.

A digital filter bank is a collection of two or more parallel digital filters that share a common input or a common output ["Multirate Systems and Filter Banks" P. P. Vaidyanathan Prentice Hall: Englewood Cliffs, N.J., 1993]. When sharing a common input the filter bank is called an analysis bank. The analysis bank splits the incoming signal into M separate signals called subband signals. The analysis filters are denoted $H_k(z)$, where $k=0$ . . . $M-1$. The filter bank is critically sampled (or maximally decimated) when the subband signals are decimated by a factor M. The total number of subband samples per unit time is then the same as the number of samples per unit time for the input signal. The synthesis bank combines these subband signals into a common output signal. The synthesis filters are denoted $F_k(z)$, for $k=0 \ldots M-1$. A maximally decimated filter bank with M channels (subbands) is shown in FIG. 1. The analysis part 101 produces the signals $V_k(z)$, which constitute the signals to be transmitted, stored or modified, from the input signal $X(z)$. The synthesis part 102 recombines the signals $V_k(z)$ to the output signal $\hat{X}(z)$.

The recombination of $V_k(z)$ to obtain the approximation $\hat{X}(z)$ of the original signal $X(z)$ is subject to several errors. One of these is aliasing, due to the decimation and interpolation of the subbands. Other errors are phase and amplitude distortion.

Following the notations of FIG. 1, the outputs of the analysis filters $H_k(z)$ 103 are $$X_k(z) = H_k(z)X(z) \tag{1}$$

where $k=0 \ldots M-1$. The decimators 104 give the outputs $$V_k(z) = \frac{1}{M}\sum_{l=0}^{M-1} X_k(z^{1/M}W^l) = \frac{1}{M}\sum_{l=0}^{M-1} H_k(z^{1/M}W^l)X(z^{1/M}W^l) \tag{2}$$

where $W=e^{-i2\pi/M}$. The outputs of the interpolators 105 are given by $$U_k(z) = V_k(z^M) = \frac{1}{M}\sum_{l=0}^{M-1} H_k(zW^l)X(zW^l) \tag{3}$$

and the sum of the signals obtained from the synthesis filters 106 can be written as $$\hat{X}(z) = \sum_{k=0}^{M-1} F_k(z)U_k(z) = \sum_{k=0}^{M-1} F_k(z)\frac{1}{M}\sum_{l=0}^{M-1} H_k(zW^l)X(zW^l) = \\
= \frac{1}{M}\sum_{l=0}^{M-1} X(zW^l)\sum_{k=0}^{M-1} H_k(zW^l)F_k(z) = \frac{1}{M}\sum_{l=0}^{M-1} X(zW^l)A_l(z) \tag{4}$$

where $$A_l(z) = \sum_{k=0}^{M-1} H_k(zW^l)F_k(z) \tag{5}$$

is the gain for the $l^{th}$ alias term $X(zW^l)$. Eq. (4) can be rewritten as $$\hat{X}(z) = \frac{1}{M}\left\{X(z)A_0(z) + \sum_{l=1}^{M-1} X(zW^l)A_l(z)\right\} \tag{6}$$

The last sum on the right hand side (RHS) constitutes the sum of all non-wanted alias terms. Canceling all aliasing, that is forcing this sum to zero by means of proper choices of $H_k(z)$ and $F_k(z)$, gives $$\hat{X}(z) = \frac{1}{M}X(z)A_0(z) = \frac{1}{M}X(z)\sum_{k=0}^{M-1} H_k(z)F_k(z) = X(z)T(z) \tag{7}$$

where $$T(z) = \frac{1}{M}\sum_{k=0}^{M-1} H_k(z)F_k(z) \tag{8}$$

is the overall transfer function or distortion function. Choosing the synthesis filter $F_k(z)$ so that $$F_k(z) = z^{-N}\tilde{H}_k(z) \tag{9}$$

where N is the order of the analysis filter, results in the following transfer function:

$$T(z) = \frac{1}{M}\sum_{k=0}^{M-1} H_k(z)F_k(z) = \frac{z^{-N}}{M}\sum_{k=0}^{M-1} H_k(z)\tilde{H}_k(z) \tag{10}$$

The notation $\tilde{H}(z)$ is the z-transform of the time-reversed and complex-conjugated sequence $h_k(n)$. Eq. (10) evaluated on the unit circle gives $$T(e^{jw}) = \frac{e^{-jwN}}{M}\sum_{k=0}^{M-1} H_k(e^{jw})H_k^*(e^{-jw}) = \frac{e^{-jwN}}{M}\sum_{k=0}^{M-1} |H_k(e^{jw})|^2 \tag{11}$$

Eq. (11) shows that $T(z)$ has linear phase, and thus has no phase distortion. Further, if the last sum on the RHS is a constant, there is no amplitude distortion. The overall transfer function is in this case simply a delay with a constant scale factor c, i.e.

$$T(z) = cz^{-N} \tag{12}$$

which substituted into Eq. (7) gives $$\hat{X}(z) = cz^{-N}X(z) \tag{13}$$

The type of filters that satisfy Eq. (13) are said to have the perfect reconstruction (PR) property.

Cosine Modulated Filterbanks

In a cosine modulated filterbank the analysis filters $h_k(n)$ are cosine modulated versions of a symmetric low-pass prototype filter $p_0(n)$ as $$h_k(n) = 2p_0(n)\cos\left\{\frac{\pi}{2M}(2k+1)\left(n - \frac{N}{2} - \frac{M}{2}\right)\right\} \tag{14}$$

where M is the number of channels, $k=0 \ldots M-1$, N is the prototype filter order and $n=0 \ldots N$. The sum of the real-valued prototype filter coefficients is assumed to be unity as $$\sum_{n=0}^{N} p_0^2(n) = 1 \qquad (15)$$

Following the same notation, the synthesis filters are given by $$f_k(n) = 2p_0(N-n)\cos\left\{\frac{\pi}{2M}(2k+1)\left(n - \frac{N}{2} + \frac{M}{2}\right)\right\} \qquad (16)$$

The analysis filter bank produces real-valued subband samples for real-valued input signals. The subband samples are downsampled by a factor M, which makes the system critically sampled. Depending on the choice of the prototype filter, the filterbank may constitute a near perfect reconstruction system, a so called pseudo QMF bank [U.S. Pat. No. 5,436,940], or a perfect reconstruction (PR) system. An example of a PR system is the modulated lapped transform (MLT) ["Lapped Transforms for Efficient Transform/Subband Coding" H. S. Malvar, IEEE Trans ASSP, vol. 38, no. 6, 1990]. One inherent property of the cosine modulation is that every filter has two passbands; one in the positive frequency range and one corresponding passband in the negative frequency range.

Eq. (5) can be written in matrix form as $$a = Hf \qquad (17)$$

or explicitly as $$\begin{bmatrix} A_0(z) \\ A_1(z) \\ \vdots \\ A_{M-1}(z) \end{bmatrix} = \begin{bmatrix} H_0(z) & H_1(z) & \cdots & H_{M-1}(z) \\ H_0(Wz) & H_1(Wz) & \ddots & H_{M-1}(Wz) \\ \vdots & & & \vdots \\ H_0(W^{M-1}z) & H_1(W^{M-1}z) & \cdots & H_{M-1}(W^{M-1}z) \end{bmatrix} \begin{bmatrix} F_0(z) \\ F_1(z) \\ \vdots \\ F_{M-1}(z) \end{bmatrix} \qquad (18)$$

The matrix H is called the alias component (AC) matrix. For a closer examination of this equation, f may be written as:

$$\begin{bmatrix} F_0(z) \\ F_1(z) \\ \vdots \\ F_{M-1}(z) \end{bmatrix} = \begin{bmatrix} F_0(z) & 0 & \cdots & 0 \\ 0 & F_1(z) & & \vdots \\ \vdots & & \ddots & 0 \\ 0 & \cdots & 0 & F_{M-1}(z) \end{bmatrix} \begin{bmatrix} 1 \\ 1 \\ \vdots \\ 1 \end{bmatrix} \qquad (19)$$

or in a compact form as $$f = F e \qquad (20)$$

Substituting Eq. (20) in Eq. (17), the alias gains can be written as a=HF e, where the product $$HF = U \qquad (21)$$

Is a M×M matrix, hereinafter referred to as the composite alias component matrix.

Figure 2:
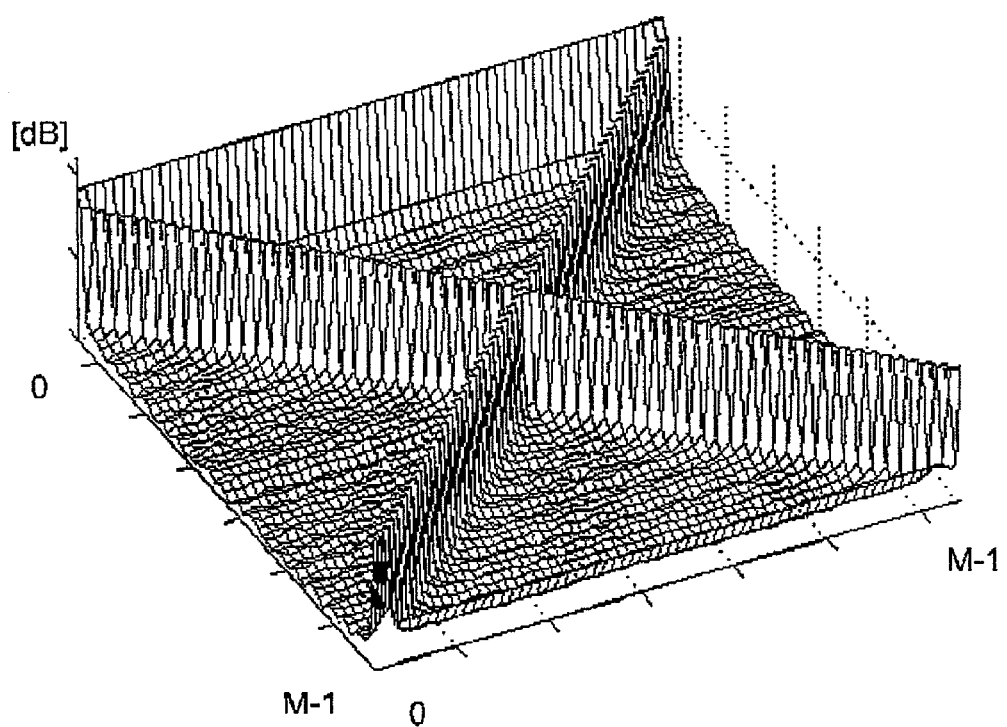
FIG. 2 shows the magnitudes in a composite alias component matrix of a cosine modulated filterbank.

For a cosine modulated system, the dominant terms in the composite alias component matrix are the first row and four diagonals. The three-dimensional plot of FIG. 2 illustrates the magnitudes of the components in this matrix. The first row holds the terms from the transfer function, Eq. (8), while the four diagonals primarily consist of the main alias terms, i.e. the aliasing due to overlap between filters and their closest neighbors. It is easily seen that the main alias terms emerge from overlap in frequency between either the filters negative passbands with frequency modulated versions of the positive passbands, or reciprocally, the filters positive passbands with frequency modulated versions of the negative passbands. Summing the terms of the rows in the composite alias component matrix, i.e. calculating the alias gains, results in cancellation of the main alias terms. The aliasing is canceled in a pairwise manner, where the first main alias term is canceled by the second in the same row. Superimposed on the main alias terms are also other smaller alias terms. If the prototype filter characteristics is so that the transition-and stop-band of the filters have substantial overlap with their modulated versions, these alias terms will be large. As an example, the second and the last row consists of alias terms induced by the overlap of filters with their closest modulated versions. For a PR system, these smaller alias terms also cancels completely when summing the terms for the alias gains. In the pseudo QMF system, however, these terms remain.

Complex-Exponential Modulated Filterbanks

Extending the cosine modulation to complex-exponential modulated according to the present invention yields the analysis filters $h_k(n)$ as $$h_k(n) = p_0(n)\exp\left\{i\frac{\pi}{2M}(2k+1)\left(n - \frac{N}{2} - \frac{M}{2}\right)\right\} \qquad (22)$$

using the same notion as before. This can be viewed as adding an imaginary part to the real-valued filterbank, where the imaginary part consists of sine modulated versions of the same prototype filter. Considering a real-valued input signal, the output from the filter bank can be interpreted as a set of subband signals, where the real and the imaginary parts are Hilbert transforms of each other. The resulting subbands are thus the analytic signals of the real-valued output obtained from the cosine modulated filterbank. Hence, due to the complex-valued representation, the subband signals are oversampled by a factor two.

The synthesis filters are extended in the same way as $$f_k(n) = p_0(N-n)\exp\left\{i\frac{\pi}{2M}(2k+1)\left(n - \frac{N}{2} + \frac{M}{2}\right)\right\} \qquad (23)$$

Eq. (22) and (23) implies that the output from the synthesis bank is complex-valued. Using matrix notation, where $C_a$ is a matrix with analysis filters from Eq. (14), and $S_a$ is a matrix with filters as $$h_k(n) = p_0(n)\sin\left\{\frac{\pi}{2M}(2k+1)\left(n - \frac{N}{2} - \frac{M}{2}\right)\right\} \quad (24)$$

the filters of Eq. (22) is obtained as $C_a + j\, S_a$. In these matrices, k is the row index and n is the column index. Analogously, the matrix $C_s$ has synthesis filters from Eq. (16), and $S_s$ is a matrix with filters as $$f_k(n) = p_0(N-n)\sin\left\{\frac{\pi}{2M}(2k+1)\left(n - \frac{N}{2} + \frac{M}{2}\right)\right\} \quad (25)$$

Eq. (23) can thus be written $C_s + j\, S_s$, where k is the column index and n is the row index. Denoting the input signal x, the output signal y is found from $$y = (C_s + j\, S_s)(C_a + j\, S_a)x = (C_s C_a - S_s S_a)x + j(C_s S_a + S_s C_a)x \quad (26)$$

As seen from Eq. (26), the real part consists of two terms; the output from the ordinary cosine modulated filterbank and an output from a sine modulated filterbank. It is easily verified that if a cosine modulated filterbank has the PR property, then its sine modulated version, with a change of sign, constitutes a PR system as well. Thus, by taking the real part of the output, the complex-exponential modulated system offers the same reconstruction accuracy as the corresponding cosine modulated versions.

The complex-exponential modulated system can be extended to handle also complex-valued input signals. By extending the number of channels to 2M, i.e. adding the filters for the negative frequencies, and keeping the imaginary part of the output signal, a pseudo QMF or a PR system for complex-valued signals is obtained.

Figure 3:
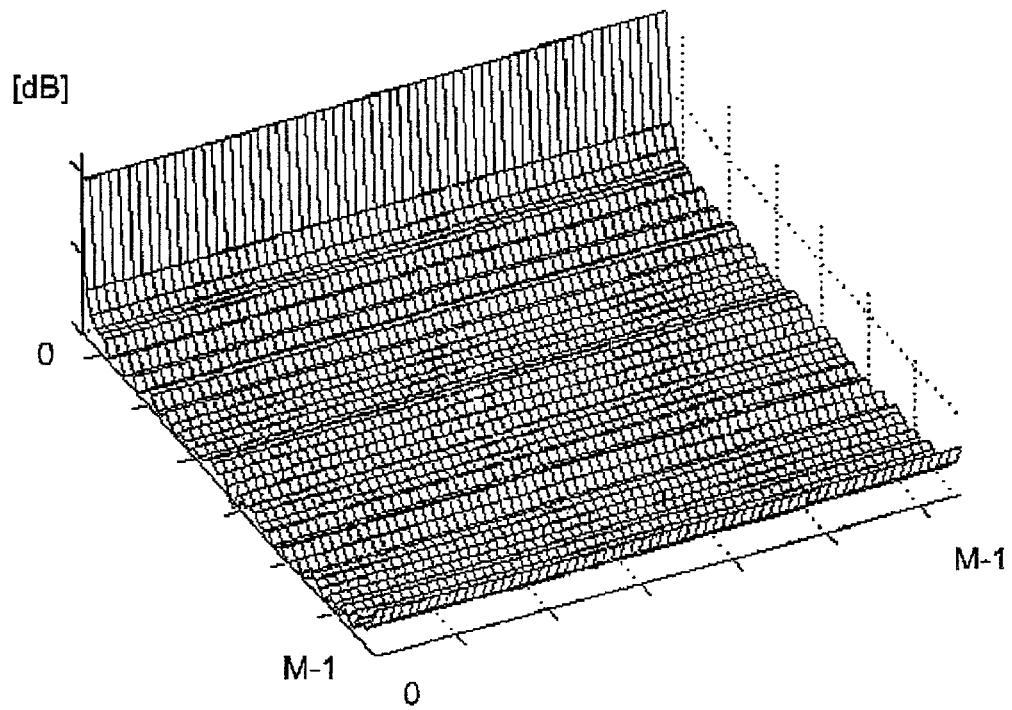
FIG. 3 shows the magnitudes in a composite alias component matrix of a complex-exponential modulated filterbank.

Examining the composite alias component matrix from Eq. (21), the main alias diagonals vanish for the complex-exponential modulated filterbank. This is easily understood since the complex-exponential modulated filterbank has only one passband for every filter. In other words, the filterbank is free from main alias terms, and do not rely on the pairwise aliasing cancellation mentioned above. The composite alias component matrix has the dominant terms on the first row only. FIG. 3 shows the magnitude of the components in the resulting matrix. Depending on the prototype filter characteristics, the terms on rows 1 through M−1, are more or less attenuated. The absence of main alias terms makes the aliasing cancellation constraint from the cosine (or sine) modulated filterbank obsolete in the complex-exponential modulated version. Both the analysis and synthesis filters can thus be found from $$h_k(n) = f_k(n) = p_0(n)\exp\left\{i\frac{\pi}{2M}(2k+1)\left(n - \frac{N}{2}\right)\right\} \quad (27)$$

since $p_0(n) = p_0(N-n)$ for a symmetric prototype filter. As before, M is the number of channels, k=0 ... M−1, N is the prototype filter order and n=0 ... N.

Referring to Eq. (4), the Z-transform of the real part of the output signal $\hat{x}(n)$ is $$Z\{\operatorname{Re}(\hat{x}(n))\} = \hat{X}_R(z) = \frac{\hat{X}(z) + \hat{X}*(z)}{2} \quad (28)$$

The notation $\hat{X}*(z)$ is the Z-transform of the complex-conjugated sequence $\hat{x}(n)$. From Eq. (4), it follows that the transform of the real part of the output signal is $$2M\hat{X}_R(z) = \sum_{l=0}^{M-1}(X(zW^l)A_l(z) + X(zW^{-l})A_l*(z)) \quad (29)$$

where it is used that the input signal x(n) is real-valued. Eq. (29) may after manipulation be written $$2M\hat{X}_R(z) = X(z)\{A_0(z) + A_0*(z)\} + \quad (30)$$
$$X(-z)\{A_{M/2}(z) + A_{M/2}*(z)\} +$$
$$\sum_{l=1}^{M/2-1} X(zW^l)\{A_l(z) + A_{M-l}*(z)\} +$$
$$\sum_{l=1}^{M/2-1} X(zW^{-l})\{A_{M-l}(z) + A_l*(z)\}$$

By inspecting Eq. (30), and recalling the transform of Eq. (28), it is obvious that the real part of $a_0(n)$ must be a dirac pulse for a PR system. Moreover, the real part of $a_{M/2}(n)$ must be zero and the alias gains, for l=1 ... M/2−1, must satisfy $$A_{M-l}(z) = -A_l*(z) \quad (31)$$

In pseudo QMF systems, Eq. (31) holds true only approximately. Moreover, the real part of $a_0(n)$ is not exactly a dirac-pulse, nor is the real part of $a_{M/2}(n)$ exactly zero.

Modification of Subband Signals

Figure 4:
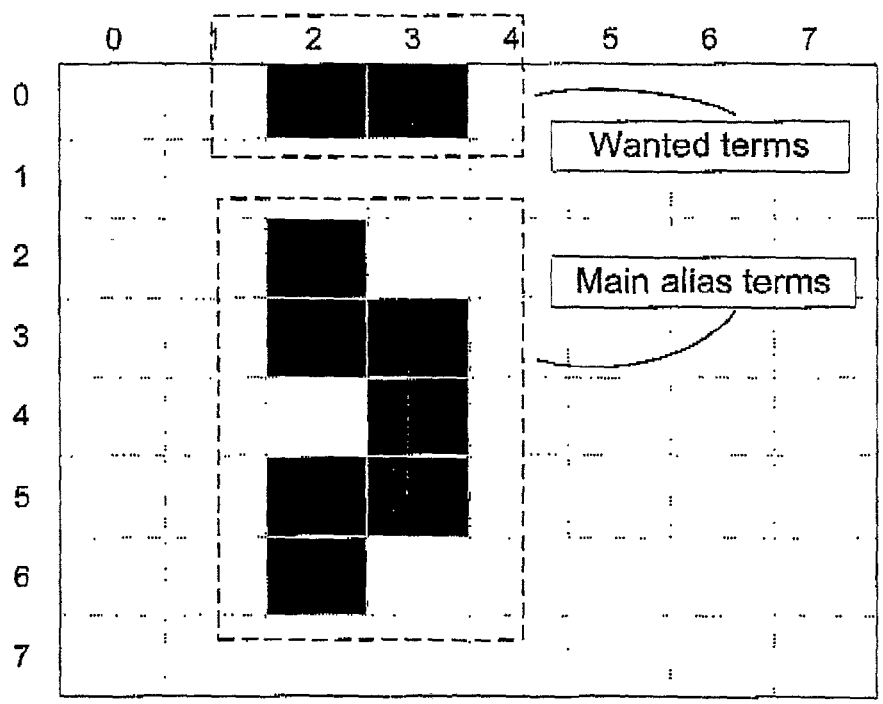
FIG. 4 illustrates wanted terms and main alias terms in a cosine modulated filterbank adjusted for a bandpass filter response.

Changing the gains of the channels in a cosine modulated filterbank, i.e. using the analysis/synthesis system as an equalizer, renders severe distortion due to the main alias terms. Say for example that the intention is to adjust an eight-channel filterbank for a band-pass response, where except for the second and third channel all subband signals are set to zero. The composite alias component matrix from Eq. (21) is then an 8×8 matrix where all elements are zero except for the elements on the second and third column, FIG. 4. There are seven significant alias terms left as indicated in the figure. The aliasing from rows three and five will be canceled, since the main alias terms in these rows have the same gains, i.e. the pairwise cancellation is working intentionally. In rows two, four and six however, there are single alias terms, since their corresponding alias terms have zero gain. The alias cancellation will hence not work as intended, and the aliasing in the output signal will be substantial.

From this example it is obvious that a substantial improvement is achieved when using complex-exponential modulated filterbanks as equalizers. The 8-channel system depicted in FIG. 4 has a prototype filter of order 128. The total aliasing attenuation is only 16 dB in the above equalizer example. Moving to complex-exponential modulation gives an aliasing attenuation of 95 dB. Due to the non-existing main alias terms, the resulting aliasing is dependent only on the suppression of the alias terms emanating from overlap between filters and their modulated versions. It is thus of great importance to design the prototype filter for maximum suppression of the alias gains terms. The first term of the RHS of Eq. (30) evaluated on the unit circle gives the error energy $\epsilon_t$ of the transfer function as $$e_t = \frac{1}{4\pi}\int_{-\pi}^{\pi}\left(\frac{|A_0(e^{j\omega}) + A_0^*(e^{-j\omega})|}{2M} - 1\right)^2 d\omega \qquad (32)$$

The energy of the total aliasing $\epsilon_a$ can be calculated by evaluating all remaining terms on the RHS of Eq. (30) on the unit circle as $$e_a = \frac{1}{8\pi M^2}\int_{-\pi}^{\pi}|A_{M/2}(e^{j\omega}) + A_{M/2}^*(e^{-j\omega})|^2 \qquad (33)$$

$$d\omega + \frac{1}{8\pi M^2}\sum_{l=1}^{M/2-1}\int_{-\pi}^{\pi}\{|A_l(e^{j\omega}) + A_{M-l}^*(e^{-j\omega})|^2$$

$$+ |A_{M-l}(e^{j\omega}) + A_l^*(e^{-j\omega})|^2\}d\omega$$

Due to symmetry, Eq. (9) and the fact $$P_0(z) = z^{-N}\tilde{P}_0(z) \qquad (34)$$

the terms within the curly braces of the sum in Eq. (33) are equal. The total aliasing energy thus has M/2−1 terms as $$e_a = \frac{1}{8\pi M^2}\int_{-\pi}^{\pi}|A_{M/2}(e^{j\omega}) + A_{M/2}^*(e^{-j\omega})|^2 \qquad (35)$$

$$d\omega + \frac{1}{4\pi M^2}\sum_{l=1}^{M/2-1}\int_{-\pi}^{\pi}|A_l(e^{j\omega}) + A_{M-l}^*(e^{-j\omega})|^2 d\omega$$

The minimization of the alias gain terms is done by optimizing the prototype filter. This is preferably accomplished by minimizing a composite objective function, using standard nonlinear optimization algorithms, for example the Downhill Simplex Method ["Numerical Recipes in C, the Art of Scientific Computing, Second Edition" W. H. Press, S. A. Teukolsky, W. T. Vetterling, B. P. Flannery, Cambridge University Press, NY, 1992]. For alias term minimization (ATM) of the prototype filter according to the invention, the objective function looks like $$\epsilon_{tot}(\alpha) = \alpha\epsilon_t + (1-\alpha)\epsilon_a \qquad (36)$$

During the optimization, a random equalization curve is applied to the filterbank when calculating $\epsilon_a$, i.e. the analysis and synthesis filters are multiplied with gainfactors $g_k$ as $$H_k^{(eq)}(z) = g_k H_k(z) \text{ and } F_k^{(eq)}(z) = g_k F_k(z) \qquad (37)$$

and the resulting filters $H_k^{(eq)}$ and $F_k^{(eq)}$, k=0 . . . M−1, are used when calculating the alias gain terms $A_l(z)$ for l=1 . . . M−1.

Figure 5:
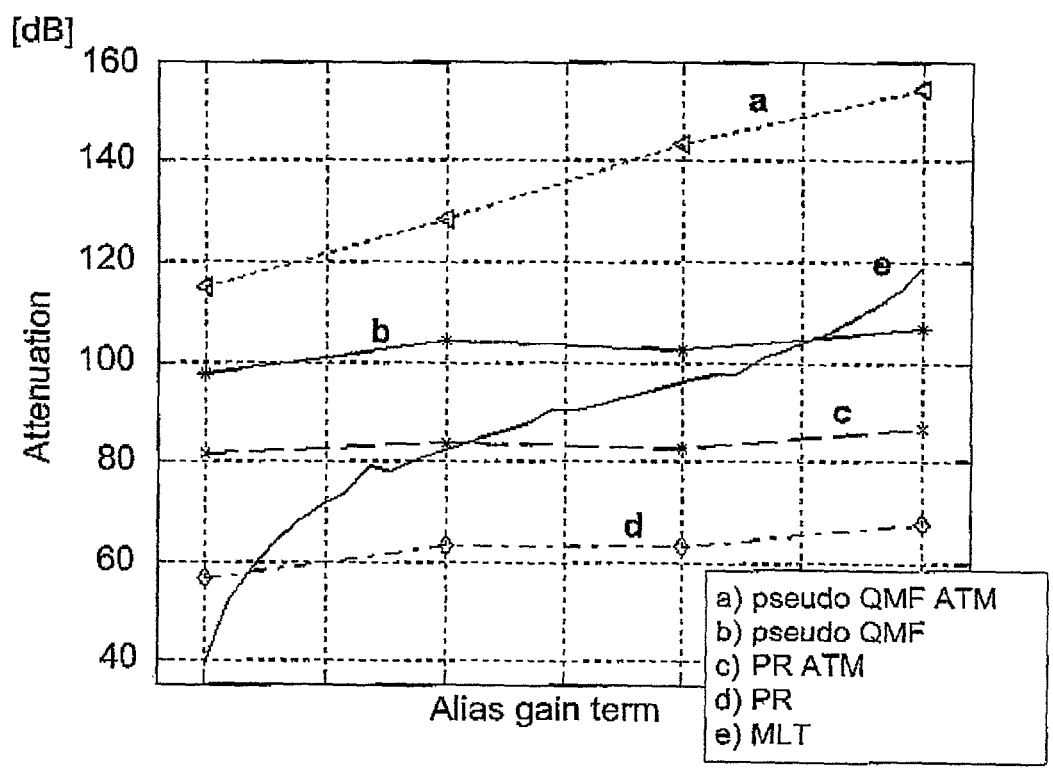
FIG. 5 shows the attenuation of alias gain terms for different realizations of complex-exponential modulated filterbanks.

In FIG. 5, the alias gains of five different complex-exponential modulated systems are compared. Four of these are 8-channel systems and one is a 64-channel system. All of the systems have prototype filter lengths of 128. The dotted trace and the solid trace with stars shows alias components for two psuedo QMF systems, where one is alias term minimized. The dashed and the dash-dotted traces are the components for two 8-channel perfect reconstruction systems, where again one of the systems is alias term minimized. The solid trace is the alias components for a complex-exponential modulated lapped transform (MLT). All the systems are adjusted for band-pass responses according to the example above and the results are tabulated in Table 1. The rejection of total aliasing is calculated as the inverse of Eq. (33). The passband flatness is calculated as the inverse of Eq. (32) with the integration interval adjusted for the bandpass response.

TABLE 1

| System | Rejection of total aliasing | Passband flatness |
| --- | --- | --- |
| 8-ch Pseudo QMF ATM N = 128 | 114, 7 dB | 98, 1 dB |
| 8-ch Pseudo QMF N = 128 | 95, 4 dB | 87, 6 dB |
| 8-ch PR ATM N = 127 | 77, 3 dB | 132, 7 dB |
| 8-ch PR N = 127 | 55, 0 dB | 93, 6 dB |
| 64-ch MLT N = 127 | 38, 5 dB | 87, 1 dB |

As seen from the numbers in Table 1, a substantial improvement is achieved when moving from the 64-channel MLT to the 8-channel PR systems. The MLT is a perfect reconstruction system and has only (N+1)/2M=1 coefficient per polyphase component. The number of coefficients for the 8-channel PR systems are 128/16=8. This enables filters with higher stopband attenuation and higher rejection of alias terms. Moreover, it is seen that alias term minimization of the PR system rejects the aliasing and improves the passband flatness significantly. Comparing the pseudo QMF systems and the PR systems, it is clear that the aliasing rejection improves by 40 dB while almost preserving the passband flatness. An additional alias rejection of approximately 20 dB and improved passband flatness of 10 dB is achieved when minimizing the alias terms. Thus, it is clear that the perfect reconstruction constraint imposes limitations to a filterbank used in an equalization system. A pseudo QMF system can always be designed for adequate reconstruction accuracy, since all practical digital implementations have limited resolution in the numeric representation. For both the pseudo QMF and the PR system, it is obvious that an optimum system is built on a prototype filter that has large rejection of the stopband. This imposes the usage of prototype filters with relative lengths longer than the windows used in the MLT.

A great advantage of the complex-exponential modulated system is that the instantaneous energy is easily calculated since the subband signals constitute the analytic signals of the real-valued subband signals obtained from a cosine modulated filterbank. This is a property of great value in for example adaptive filters, automatic gain controls (AGC), in multiband companders, and in spectral band replication systems (SBR), where a filterbank is used for the spectral envelope adjustment. The averaged energy within a subband k might be calculated as:

$$E_k(m) = \sum_{n=-L+1}^{L-1} |v_k(mL+n)|^2 w(n) \quad (38)$$

where $v_k(n)$ is the subband samples of channel k, and w(n) is a window of length 2L−1 centered around n=0. This measure is then used as an input parameter for the adaptation of gain-calculation algorithms.

Practical Implementations

Figure 6:
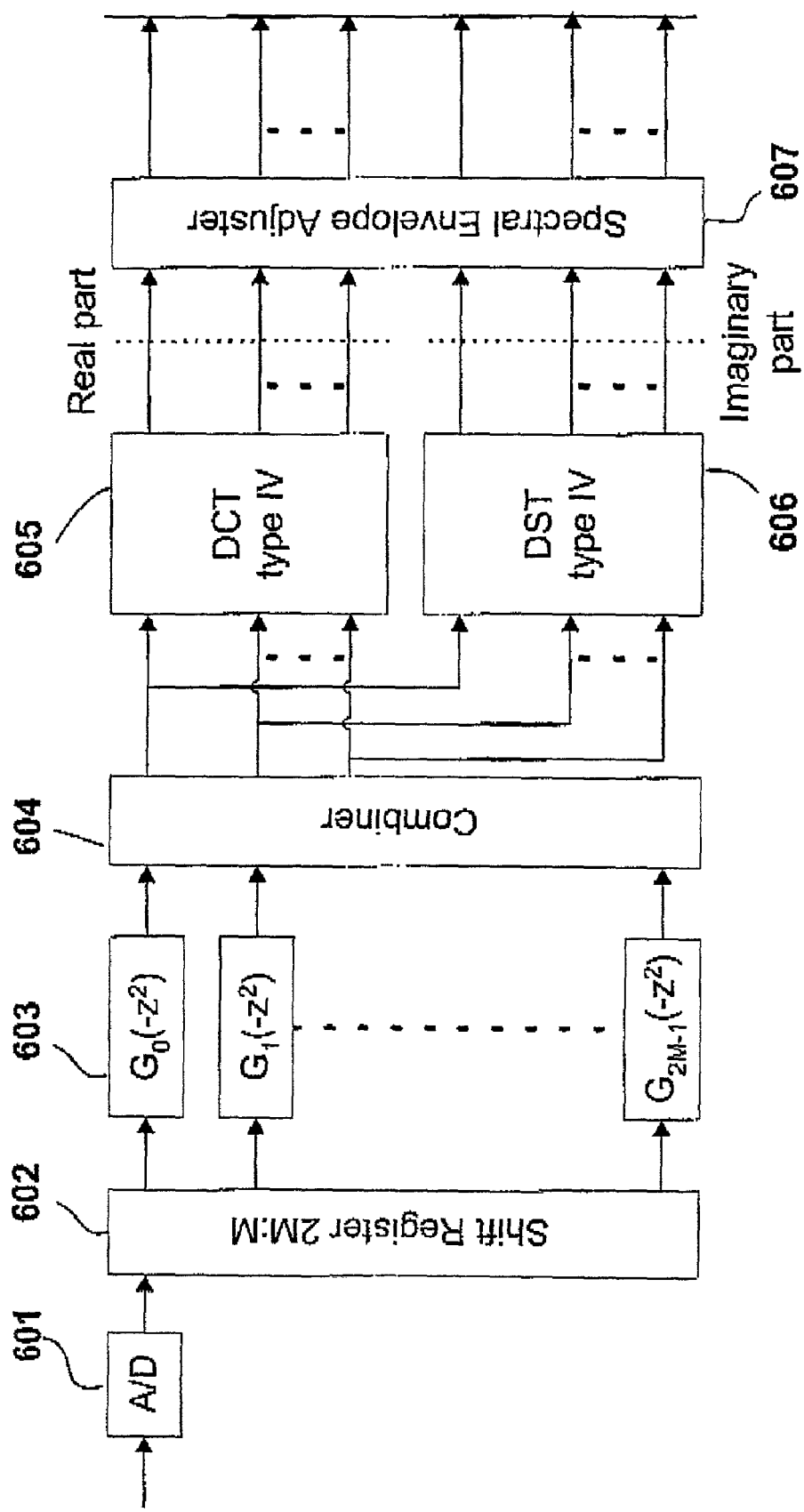
FIG. 6 illustrates the analysis part of a complex-exponential modulated filterbank system according to the present invention.

Using a standard PC or DSP, real-time operation of a complex-exponential modulated filterbank is possible. The filterbank may also be hard-coded on a custom chip. FIG. 6 shows the structure for an effective implementation of the analysis part of a complex-exponential modulated filterbank system. The analogue input signal is first fed to an A/D converter 601. The digital time domain signal is fed to a shift register holding 2M samples shifting M samples at a time 602. The signals from the shift register are then filtered through the polyphase coefficients of the prototype filter 603. The filtered signals are subsequently combined 604 and in parallel transformed with a DCT-IV 605 and a DST-IV 606 transform. The outputs from the cosine and the sine transforms constitute the real and the imaginary parts of the subband samples respectively. The gains of the subband samples are modified according to the current spectral envelope adjuster setting 607.

Figure 7:
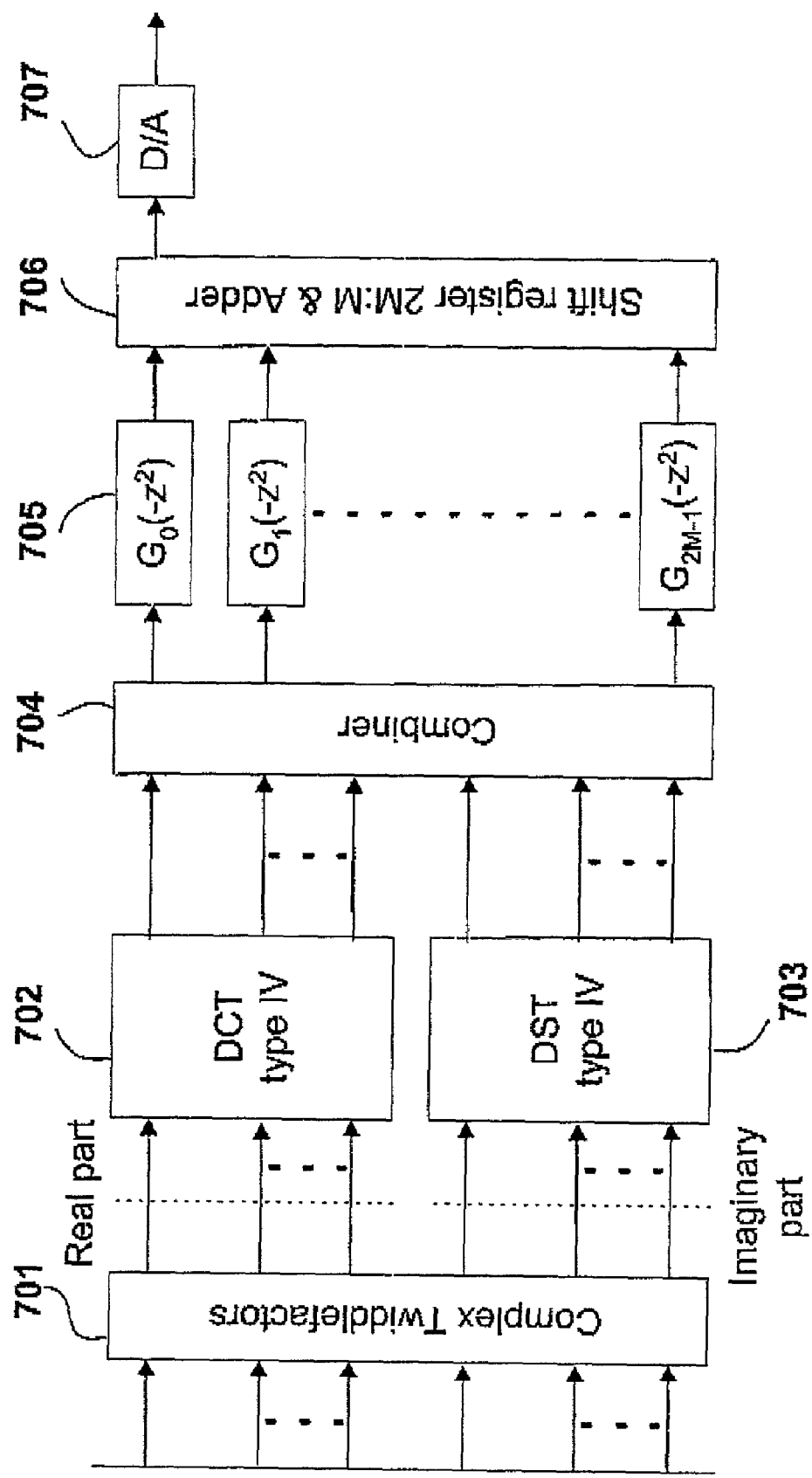
FIG. 7 illustrates the synthesis part of a complex-exponential modulated filterbank system according to the present invention.

An effective implementation of the synthesis part of a complex-exponential modulated system is shown in FIG. 7. The subband samples are first multiplied with complex-valued twiddlefactors 701, and the real part is modulated with a DCT-IV 702 and the imaginary part with a DST-IV 703 transform. The outputs from the transforms are combined 704 and fed through the polyphase components of the prototype filter 705. The time domain output signal is obtained from the shift register 706. Finally, the digital output signal is converted back to an analogue waveform 707.

The above-described embodiments are merely illustrative for the principles of the complex-exponential modulated filterbank systems according to the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A method for reduction of aliasing emerging from modifications of spectral coefficients or subband signals obtained from a digital filterbank, comprising:
    providing a symmetric low-pass prototype filter $p_0(n)$, having filter order N;
    building an M-channel filterbank by complex-exponential modulation of said prototype filter;
where said filter has analysis and synthesis filter coefficients based on $$h_k(n) = p_0(n) \exp\left\{i\frac{\pi}{2M}(2k+1)\left(n - \frac{N}{2}\right)\right\},$$

and n=0 ... N, and k=0 ... M−1;
    filtering a real-valued time domain signal through an analysis part of said filterbank;
    modifying complex-valued subband signals obtained from said filtering;
    filtering said modified complex-valued subband signals through the synthesis part of said filterbank; and
    taking the real part of a complex-valued time domain output signal, where said output signal is a sum of the signals obtained from said synthesis filtering;
wherein said optimization of said low-pass prototype filter is accomplished by minimizing a composite objective function $\epsilon_{tot}(\alpha)$ as $$\epsilon_{tot}(\alpha) = \alpha\epsilon_t + (1-\alpha)\epsilon_a$$

where α is a weighting constant, $\epsilon_t$ is the passband error and $\epsilon_a$ is the aliasing error; and wherein said passband error $\epsilon_t$ is calculated as $$\varepsilon_t = \frac{1}{4\pi}\int_{-\pi}^{\pi}\left(\frac{|A_0(e^{j\omega}) + A_0^*(e^{-j\omega})|}{2M} - 1\right)^2 d\omega,$$

and said aliasing error $\epsilon_a$ is calculated as $$\varepsilon_a = \frac{1}{8\pi M^2}\int_{-\pi}^{\pi}|A_{\frac{M}{2}}(e^{j\omega}) + A_{\frac{M}{2}}^*(e^{-j\omega})|^2 d\omega +$$

$$\frac{1}{4\pi M^2}\sum_{l=1}^{\frac{M}{2}-1}\int_{-\pi}^{\pi}|A_l(e^{j\omega}) + A_{M-l}^*(e^{-j\omega})|^2 d\omega$$

where $A_l(e^{j\omega})$, l=0 ... M/2, are the alias gain terms evaluated on the unit circle.

2. A method according to claim 1, wherein said complex-exponential modulated filterbank is used as the envelope adjusting filterbank in a high frequency reconstruction system.

3. A method according to claim 1, wherein said complex-exponential modulated filterbank is used as the filters in a digital equalizing system.

4. A method according to claim 1, wherein said complex-exponential modulated filterbank is used in an adaptive filtering system.

5. A method according to claim 1, wherein said complex-exponential modulated filterbank is used in a multiband compander system.

6. A method according to claim 1, wherein said low-pass prototype filter has a filter order N that is higher than 2M−1, where M is the number of channels in said digital filterbank.

7. A method according to claim 1, wherein said alias gain terms are calculated using gain adjusted versions of said analysis and synthesis filters according to $$h_k^{(eq)}(n) = g_k h_k(n) \text{ and } f_k^{(eq)}(n) = g_k f_k(n),$$

where $g_k$ represents randomized or deterministic real-valued gainfactors, n=0 ... N, and k=0 ... M−1.

8. A method according to claim 1, wherein said low-pass prototype filter has a filter order of at least a number N, where N is chosen so that said composite objective function is smaller than a predefined value.

9. The method of claim 1, in which the step of modifying the complex-valued subband signals includes a step of changing gains of the subband signals or quantizing the subband signals.

* * * * *